(12) United States Patent
Kawashima

(10) Patent No.: US 9,356,428 B2
(45) Date of Patent: May 31, 2016

(54) NITRIDE SEMICONDUCTOR SURFACE EMITTING LASER AND METHOD OF MANUFACTURING THE SAME

(71) Applicant: CANON KABUSHIKI KAISHA, Tokyo (JP)

(72) Inventor: Takeshi Kawashima, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 14/067,615

(22) Filed: Oct. 30, 2013

(65) Prior Publication Data
US 2014/0126600 A1 May 8, 2014

(30) Foreign Application Priority Data
Nov. 2, 2012 (JP) .................. 2012-242592

(51) Int. Cl.
| | |
|---|---|
| H01S 5/00 | (2006.01) |
| H01S 5/183 | (2006.01) |
| H01S 5/343 | (2006.01) |
| H01S 5/30 | (2006.01) |
| B82Y 20/00 | (2011.01) |

(52) U.S. Cl.
CPC ............. *H01S 5/18358* (2013.01); *B82Y 20/00* (2013.01); *H01S 5/18383* (2013.01); *H01S 5/3063* (2013.01); *H01S 5/34333* (2013.01); *H01S 5/18308* (2013.01); *H01S 5/18341* (2013.01); *H01S 5/18369* (2013.01); *H01S 2301/173* (2013.01)

(58) Field of Classification Search
CPC . H01S 5/34333; H01S 5/3063; H01S 5/0422; H01S 5/183; H01S 5/18341; H01S 5/18358; H01S 5/18369; H01S 5/18308; H01S 5/18383; H01S 2301/173; H01L 33/382; H01L 33/06; H01L 33/12; H01L 33/04; H01L 33/02; H01L 33/26; H01L 33/007; H01L 33/28; H01L 33/30; H01L 33/285; H01L 33/305; B82Y 20/00
USPC .......... 372/45.01, 43.01, 44.01, 50.1, 50.124, 372/50.11; 257/79–103; 438/22–47
See application file for complete search history.

(56) References Cited

U.S. PATENT DOCUMENTS

| | | | | |
|---|---|---|---|---|
| 5,838,707 | A | * | 11/1998 | Ramdani et al. ........... 372/50.11 |
| 5,943,359 | A | * | 8/1999 | Ramdani et al. ................ 372/96 |
| 6,927,426 | B2 | * | 8/2005 | Matsuoka et al. ............ 257/103 |

(Continued)

FOREIGN PATENT DOCUMENTS

| | | |
|---|---|---|
| EP | 1081816 A2 | 3/2001 |
| JP | 2008251641 A | 10/2008 |

*Primary Examiner* — Jessica Stultz
*Assistant Examiner* — Delma R Forde
(74) *Attorney, Agent, or Firm* — Canon U.S.A., Inc., IP Division

(57) ABSTRACT

A surface emitting laser in which a plurality of nitride semiconductor layers including a lower reflector, a plurality of active layers causing a gain by current injection, and an upper reflector are provided on a substrate, includes an n-type spacer layer formed between the lower reflector and an active layer closest to the lower reflector in the plurality of active layers, a p-type spacer layer formed between the upper reflector and an active layer closest to the upper reflector in the plurality of active layers, and an intermediate layer arranged between the plurality of active layers. The intermediate layer is configured from an Mg-doped layer including at least Mg, and a nitride semiconductor layer including In, and the Mg-doped layer and the nitride semiconductor layer including In are provided in that order from a side of the substrate.

22 Claims, 6 Drawing Sheets

(56) References Cited

U.S. PATENT DOCUMENTS

| | | | |
|---|---|---|---|
| 8,144,743 B2* | 3/2012 | Nakagawa et al. | 372/46.01 |
| 2007/0019697 A1* | 1/2007 | Miller et al. | 372/50.11 |
| 2007/0036186 A1* | 2/2007 | Corzine et al. | 372/50.11 |
| 2008/0212631 A1* | 9/2008 | Takeuchi et al. | 372/45.01 |
| 2009/0010290 A1 | 1/2009 | Mayer | |
| 2014/0097456 A1* | 4/2014 | Kawashima | 257/94 |

* cited by examiner

NITRIDE SEMICONDUCTOR SURFACE EMITTING LASER AND METHOD OF MANUFACTURING THE SAME

BACKGROUND OF THE INVENTION

1. Field of the Invention

The present invention relates to a nitride semiconductor surface emitting laser and a method of manufacturing the same, and especially related to a nitride semiconductor surface emitting laser including a plurality of active layers and a method of manufacturing the same.

2. Description of the Related Art

A vertical cavity surface emitting laser (VCSEL) is a laser in which an active layer is sandwiched by two reflectors on a substrate and a cavity is formed in the vertical direction (EP 1081816 A2).

The reflectance of a semiconductor DBR (multilayer film reflector) that configures the cavity is raised to 99.5% or more and a cavity loss is decreased, so that laser oscillation is realized.

In the VCSEL, the thickness of the active layer is extremely thinner than that of the cavity. Therefore, structurally, it is less likely to obtain a gain, and it is difficult to realize a high output.

Therefore, as a technology to increase the gain, a periodic gain structure in which a plurality of active layers is arranged at peak positions of a stationary wave in the cavity has been proposed.

When the periodic gain structure is used in the VCSEL of the nitride semiconductor, it is necessary to make an intermediate layer to be formed between the plurality of active layers into p-type in order to inject carriers into all of the plurality of active layers.

For example, when the intermediate layer is i-type or n-type, electrons to be injected from a side of an n-type layer is first injected into an active layer adjacent to the n-type layer.

Since the electron has large mobility, the electrons are leaked out from the active layer adjacent to the n-type layer, and are injected into a neighbor active layer and are injected into a further neighbor active layer.

Meanwhile, the mobility of a hole is smaller than that of the electron by 1 to 2 digits. Therefore, when holes are injected from a p-type layer, most of the holes are subjected to light emission recombination in the active layer adjacent to the p-type layer, and the holes are not injected into a neighbor active layer.

A gain is only caused in the active layer adjacent to the p-type layer even if a plurality of active layers is used, and other active layers become absorption layers.

Therefore, all intermediate layers to be formed between the active layers are made into the p-type. The intermediate layers are made into the p-type, so that the holes exist in all active layers in high concentration.

Since the electron is lighter than the hole, and is easily injected deep into a p-type layer, the carriers can be injected into all of the active layers.

SUMMARY OF THE INVENTION

A nitride semiconductor surface emitting laser of the present invention is a nitride semiconductor surface emitting laser in which a plurality of nitride semiconductor layers including a lower reflector, a plurality of active layers causing a gain by current injection, and an upper reflector are provided on a substrate, that includes:

an n-type spacer layer formed between the lower reflector and an active layer closest to the lower reflector in the plurality of active layers;

a p-type spacer layer formed between the upper reflector and an active layer closest to the upper reflector in the plurality of active layers; and an intermediate layer arranged between the plurality of active layers, and the intermediate layer is configured from an Mg-doped layer including at least Mg, and a nitride semiconductor layer including In, and the Mg-doped layer and the nitride semiconductor layer including In are provided in that order from a side of the substrate.

Further, a method of manufacturing a nitride semiconductor surface emitting laser of the present invention is a method of manufacturing a nitride semiconductor surface emitting laser in which a plurality of nitride semiconductor layers including a lower reflector, a plurality of active layers causing a gain by current injection, and an upper reflector are provided on a substrate, the method including the steps of:

forming an n-type spacer layer between the lower reflector and an active layer closest to the lower reflector in the plurality of active layers;

forming a p-type spacer layer between the upper reflector and an active layer closest to the upper reflector in the plurality of active layers; and forming an intermediate layer in which an Mg-doped layer and a nitride semiconductor layer including In are provided between the plurality of active layers from a side of the substrate.

Further features of the present invention will become apparent from the following description of exemplary embodiments (with reference to the attached drawings).

BRIEF DESCRIPTION OF THE DRAWINGS

FIG. 2A is a diagram illustrating a result of an analysis performed by a SIMS with respect to Mg in a configuration not including a nitride semiconductor layer including In.

FIG. 2B is a diagram illustrating a result of an analysis performed by SIMS with respect to Mg in a configuration including a nitride semiconductor layer including In.

DESCRIPTION OF THE EMBODIMENTS

Mg is often used as an acceptor dopant put to practical use in a nitride semiconductor. In so doing, a problem of memory effect is caused.

The memory effect is a phenomenon in which, when an Mg ingredient is used, Mg is attached inside a reactor, and the Mg is removed in the process of growing and is unintentionally mixed into a crystal.

To realize the periodic gain structure in the VCSEL of the nitride semiconductor, it is necessary to make the intermediate layer into the p-type, as described above. That is, it is necessary to be doped with Mg.

When the intermediate layer is doped with Mg, Mg is mixed into a layer formed upper than the intermediate layer, that is, Mg is mixed into the second and subsequent active layers due to the memory effect.

It is known that, when Mg is mixed into the active layer, the light emission efficiency is decreased. To realize the periodic gain structure, it is necessary to suppress the memory effect of Mg.

The present invention has been made in view of the above problem, and an objective is to provide a nitride semiconductor surface emitting laser and a method of manufacturing the same that enable suppression of the memory effect occurring when the intermediate layer is doped with Mg, and suppression of a decrease in light emission efficiency.

Next, a configuration example of a nitride semiconductor surface emitting laser of the present invention will be described with reference to FIG. 1. First, a structure thereof will be described. The nitride semiconductor surface emitting laser of the present invention includes, on a substrate, a configuration in which a plurality of nitride semiconductor layers including a lower DBR (lower multilayer film reflector), a plurality of active layers causing a gain by current injection, and an upper DBR (upper multilayer film reflector) is provided.

Figure 1:
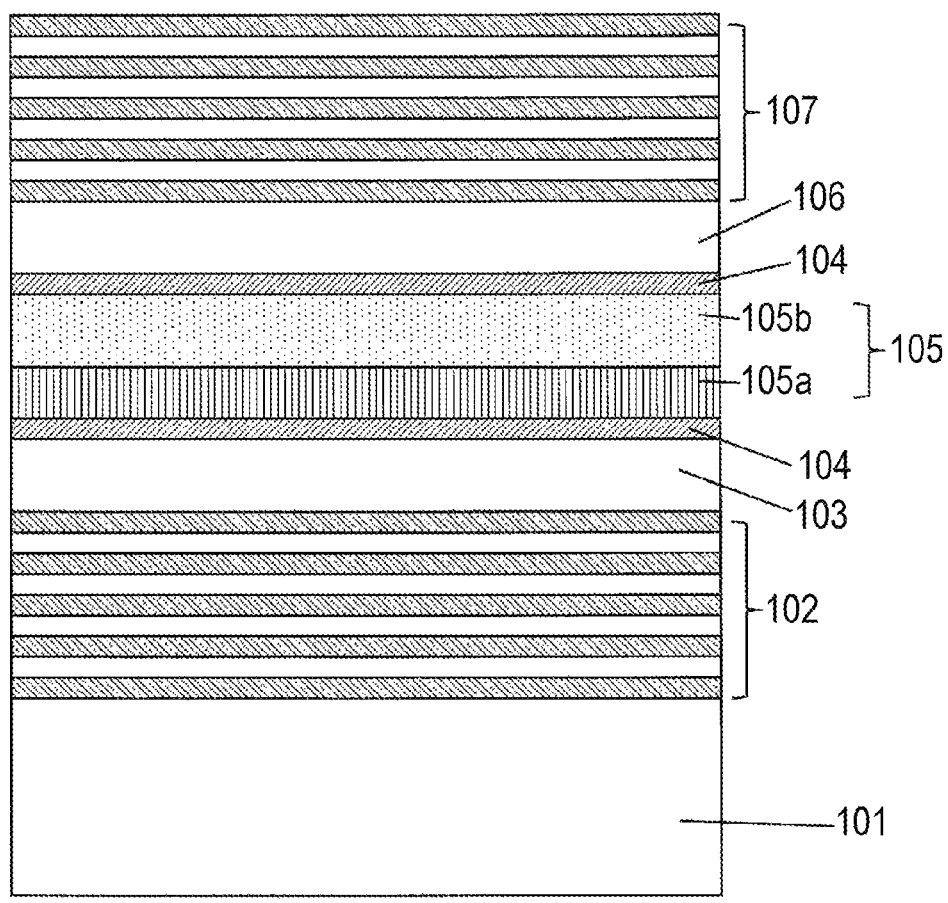
FIG. 1 is a diagram describing a configuration example of a nitride semiconductor surface emitting laser in an exemplary embodiment of the present invention.

To be specific, as illustrated in FIG. 1, a lower DBR 102, an n-type spacer layer 103, an active layer 104, an intermediate layer 105, a p-type spacer layer 106, and an upper DBR 107 are provided on a substrate 101 in order.

The lower DBR 102 is arranged on the substrate 101 side of the active layer, the upper DBR 107 is arranged on the substrate surface side of the active layer, and the two DBRs 102 and 107 form a cavity.

At least two active layers 104 are provided between the lower DBR 102 and the upper DBR 107, and a gain is caused by current injection, and a stationary wave of light in the cavity formed by the lower DBR 102 and the upper DBR 107 is amplified.

The n-type spacer layer 103 is provided between the active layer 104 closest to the lower DBR 102 and the lower DBR 102.

Similarly, the p-type spacer layer 106 is provided between the active layer 104 closest to the upper DBR 107 and the upper DBR 107.

The intermediate layer 105 is provided between the two active layers 104, and further, two layers of an Mg-doped layer 105a and a nitride semiconductor layer 105b including In are at least provided in all intermediate layers 105 in this order in the direction from the substrate side to the surface.

Next, the Mg-doped layer 105a and the nitride semiconductor layer 105b including In that configure the intermediate layer 105 will be described.

The Mg-doped layer 105a is doped with Mg. The doping concentration of Mg is adjusted according to the thickness of the Mg-doped layer 105a and the nitride semiconductor layer 105b including In, the number of the active layers, the layered structure, and the like so that the electrons can be injected into all of the active layers 104.

For example, the Mg-doped layer 105a is configured such that the side closer to the p-type spacer layer 106 has high doping concentration and the side closer to the n-type spacer layer 103 has low doping concentration.

The nitride semiconductor layer 105b including In is configured from InGaN, AlInN, AlInGaN, InN, and the like, and is inserted in order to suppress the memory effect of the Mg ingredient used in the Mg-doped layer 105a.

After the formation of the Mg-doped layer 105a, if the active layer 104 is formed without the nitride semiconductor layer 105b including In, Mg attached to an inner wall of the reactor is evaporated and is taken in to the active layer 104 in forming the Mg-doped layer 105a, and the light emission efficiency of the active layer 104 is deteriorated.

In contrast, when the nitride semiconductor layer 105b including In is formed before the formation of the active layer 104 like the present exemplary embodiment, Mg is taken into the nitride semiconductor layer 105b including In and the high purity active layer 104 can be formed, and a decrease in light emission efficiency can be suppressed.

Figure 2A:
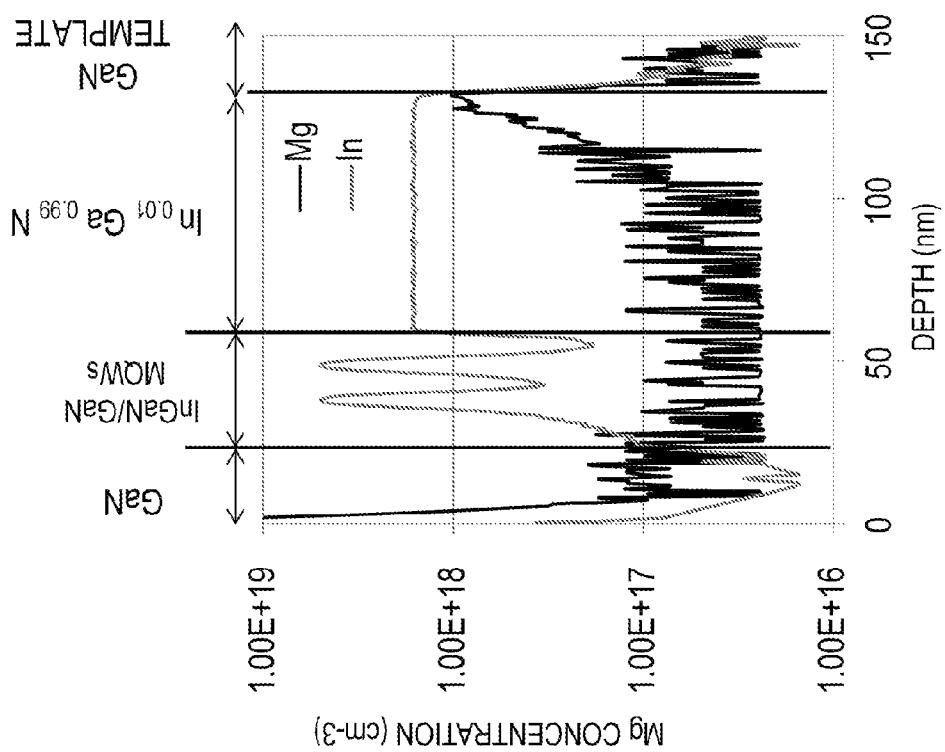
Figure 2B:
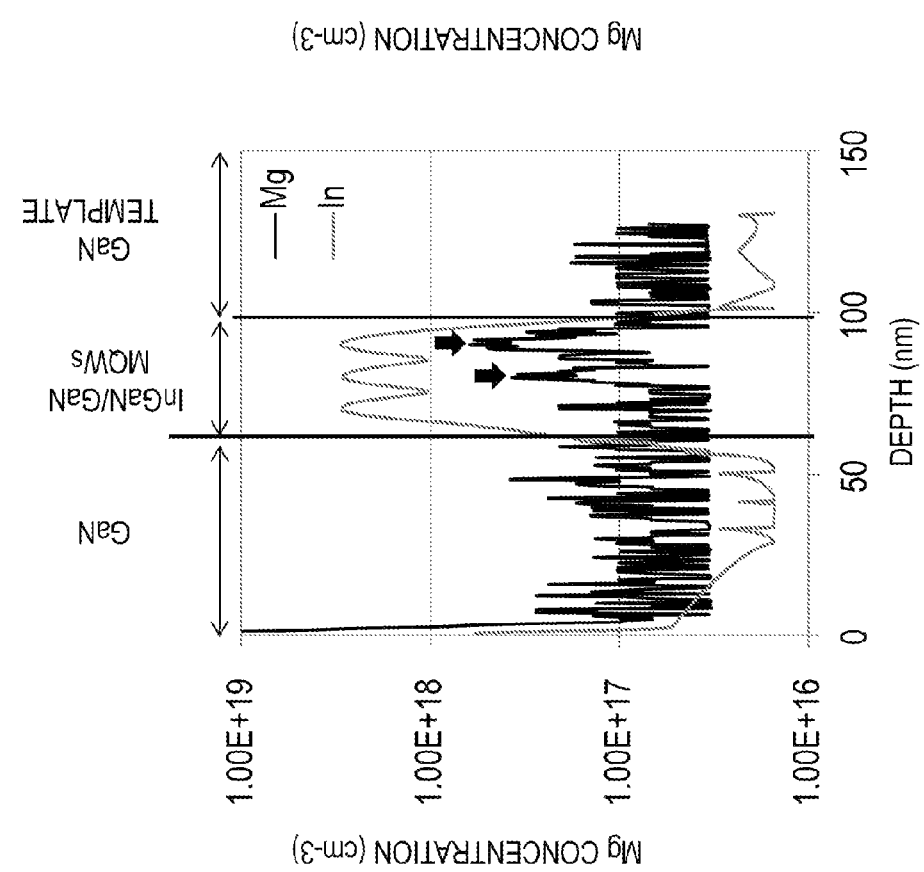

FIGS. 2A and 2B are diagrams illustrating results of analyses performed by SIMS with respect to Mg with a sample prepared such that an active layer having a multiple quantum well structure of InGaN/GaN is formed on a GaN template substrate with Mg being attached to an inner wall of a reactor of an MOCVD system (with the Mg ingredient being used in crystal growth immediately before).

FIG. 2A is a diagram illustrating a result of a configuration that does not have the nitride semiconductor layer 105b including In, and Mg is detected in an InGaN well layer (the arrows in the drawing).

FIG. 2B is a diagram illustrating a result of a configuration in which an active layer is formed through $In_{0.01}Ga_{0.99}N$ having the thickness of 70 nm as the nitride semiconductor layer 105b including In.

Mg of $1\times10^{18}$ cm$^2$ is taken in at the start of growth of $In_{0.01}Ga_{0.99}N$, and the concentration of Mg is decreased as the thickness of $In_{0.01}Ga_{0.9}N$ is increased. When $In_{0.01}Ga_{0.99}N$ grows by the thickness of 30 nm, the concentration of Mg reaches a detection limit or less, and Mg is not detected in an InGaN quantum well.

From FIGS. 2A and 2B, it can be confirmed that the memory effect of Mg is suppressed by insertion of the InGaN layer by 30 nm.

The nitride semiconductor layer 105b including In requires 30 nm in thickness from the results of FIGS. 2A and 2B.

If the film thickness is 30 nm, the nitride semiconductor layer 105b including In itself takes in Mg, and thus functions as the p-type layer. If the thickness is larger than 30 nm, a portion having the thickness functions as an i-type layer.

Considering a diffusion length of the hole, the thickness of the nitride semiconductor layer 105b including In is favorably 200 nm or less, more favorably 100 nm or less.

Further, the memory effect of Mg can be suppressed only if the nitride semiconductor layer 105b including In includes In. However, if the proportion of In becomes large and the band gap of the nitride semiconductor layer 105b including In becomes smaller than that of the active layer 104, absorption of light becomes a problem.

Therefore, it is desirable to make the band gap of the nitride semiconductor layer 105b including In larger than that of the active layer.

For example, when the active layer 104 is an $In_xGa_{1-x}N$ quantum well, and the nitride semiconductor layer 105b including In is $In_yGa_{1-y}N$, a relationship of x>y is established.

A plurality of active layers 104 is arranged at positions of peaks of the stationary wave in the cavity configured from the lower DBR 102 and the upper DBR 107 in order to make the gain larger. Therefore, the distance between the plurality of active layers 104 is roughly caused to be 0.5nλ (n=1, 2, 3 . . . ) where the wavelength of the stationary wave is λ.

When the distance between the active layers 104 is 1.0λ or more (n≥2), there are n−1 peaks of the stationary wave between the active layers. When the Mg-doped layer 105a is arranged at a position of the peak, the optical absorption of Mg becomes a problem.

Figure 3:
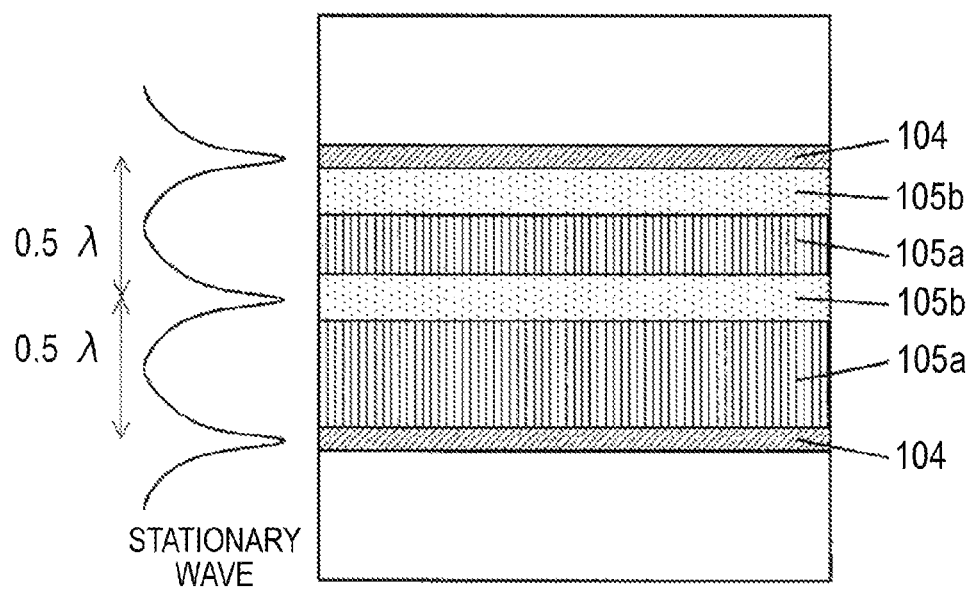
FIG. 3 is a diagram illustrating one example of a structure of an intermediate layer in an exemplary embodiment of the present invention.

Therefore, like FIG. 3, the nitride semiconductor layers 105b including In are arranged at the positions of the peaks of the stationary wave, and two or a plurality of pairs of the Mg-doped layer 105a and the nitride semiconductor layer 105b including In are arranged, so that the light absorption due to a dopant can be suppressed.

The more active layers are better as long as the carriers can be injected into all of the active layers. However, if the number of the active layers is too large, the electrons are subjected to light emission recombination in the front active layers as viewed from the n-type layer side, and are not injected into deeper active layers.

Therefore, the number of the active layers is favorably, two or three.

Further, similarly, if the intermediate layer is thick, injection of the electrons into the deeper active layers is difficult.

Therefore, the distance between the active layer closest to the p-type layer and the active layer closest to the n-type layer is favorably 200 nm, and more favorably, 100 nm or less.

Another configuration example of the nitride semiconductor surface emitting laser in the present exemplary embodiment will be described.

As the substrate 101, a substrate on which a nitride semiconductor can be grown. For example, GaN, sapphire, Si, GaAs, ZnO, and the like can be used.

The lower DBR 102 may be, for example, a nitride semiconductor DBR such as AlGaN/GaN, a dielectric material DBR such as $Ta_2O_5/SiO_2$, and the like.

In a case of a substance through which the electric current cannot flow, such as the dielectric material DBR, the lower DBR 102 is formed such that the substance is embedded in a part of the semiconductor layer.

The n-type spacer 103 layer is provided between the active layer closest to the lower DBR 102 and the lower DBR 102, and the thickness is adjusted so that the peak of the stationary wave in the cavity is overlapped with the active layer 104.

A plurality of the active layers 104 is arranged in the cavity configured between the lower DBR 102 and the upper DBR 107.

There may be a case where the amount of injection of the carriers differs among the active layers depending on the configuration of the intermediate layer 105 and the number of the active layers. In such a case, the configuration of the active layer is adjusted to the injection of the carriers.

For example, the concentration of the electrons injected into each active layer from the n-type layer is decreased toward the p layer side. Therefore, it is configured such that the number of the quantum wells of the active layer closer to the n-type layer side is increased and the number of quantum wells of the active layer closer to the p-type layer side is decreased.

The p-type spacer layer 106 is provided between the active layer closest to the upper DBR 107 and the upper DBR 107, and the thickness is adjusted so that the peak of the stationary wave in the cavity is overlapped with the active layer 104, similarly to the n-type spacer layer.

The upper DBR 107 may be configured from a semiconductor, or may be a dielectric material, similarly to the lower DBR 102.

Note that the reflector is not limited to the DBR as long as the cavity can be formed by a pair of reflectors. That is, the lower reflector and the upper reflector may be configured from any reflector such as a reflector made of a photonic crystal other than the DBR.

EXEMPLARY EMBODIMENTS

Hereinafter, exemplary embodiments of the present invention will be described.

First Embodiment

Figure 4:
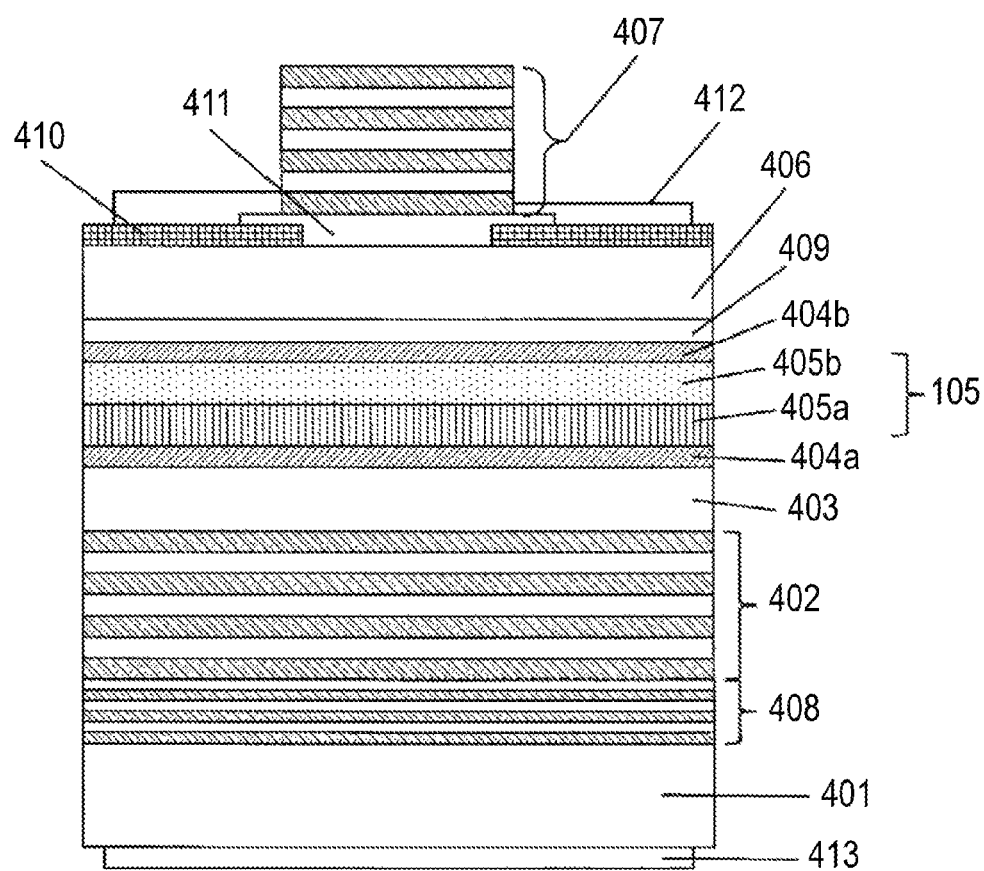
FIG. 4 is a cross sectional view describing a configuration example of a surface emitting laser in a first embodiment of the present invention.

As a first embodiment, a configuration example of a nitride semiconductor surface emitting laser and a method of manufacturing the same to which the present invention is applied will be described with reference to FIG. 4.

In the nitride semiconductor surface emitting laser of the present exemplary embodiment, the number of active layers is two, and the thickness between the active layers is $0.5\lambda$.

As a substrate 101, an n-type GaN substrate 401 is used.

Next, a superlattice 408 of $Al_{0.50}Ga_{0.50}N/GaN$ as a strain reducing layer for forming a lower DBR 102 is formed on the n-GaN substrate 401. The thickness of both of the substrate and the superlattice are 4 nm.

As the lower DBR 102, a DBR 402 of $Al_{0.50}Ga_{0.50}N/GaN$ is formed. The $Al_{0.50}Ga_{0.50}N$ having the thickness of $\lambda/4$ and GaN are made into a pair and are provided by 40 periods. Following that, n-GaN 403 is formed as an n-type spacer layer 103, and a quantum well structure 404a that is 3 periods of $In_{0.10}Ga_{0.90}N/GaN$ is formed as a first active layer 104. Next, a p-GaN 405a with which Mg is doped by 48 nm is formed as an Mg-doped layer 105a, and $In_{0.01}Ga_{0.99}N$ 405b having the thickness of 30 nm is formed as a nitride semiconductor layer 105b including In, so that an intermediate layer 105 having the thickness of $0.5\lambda$ is completed.

Next, a quantum well structure 404b of 3 periods of $In_{0.10}Ga_{0.90}N/GaN$ is formed as a second active layer 104.

As the rest of layers, p-$Al_{0.20}Ga_{0.80}N$ 409 for blocking electrons and a p-GaN 406 as a p-type spacer layer 106 are formed.

Next, $SiO_2$ 410 having an opening for current confinement is formed.

Following that, ITO 411 for current injection is formed at a portion of the opening of the $SiO_2$, and a dielectric material DBR 407 of $Ta_2O_5/SiO_2$ is formed on the ITO 411 as an upper DBR 107.

Finally, an electrode 412 and an electrode 413 for energization to a surface and a back surface of the substrate are formed, so that the nitride semiconductor surface emitting laser is completed.

Second Embodiment

Figure 5:
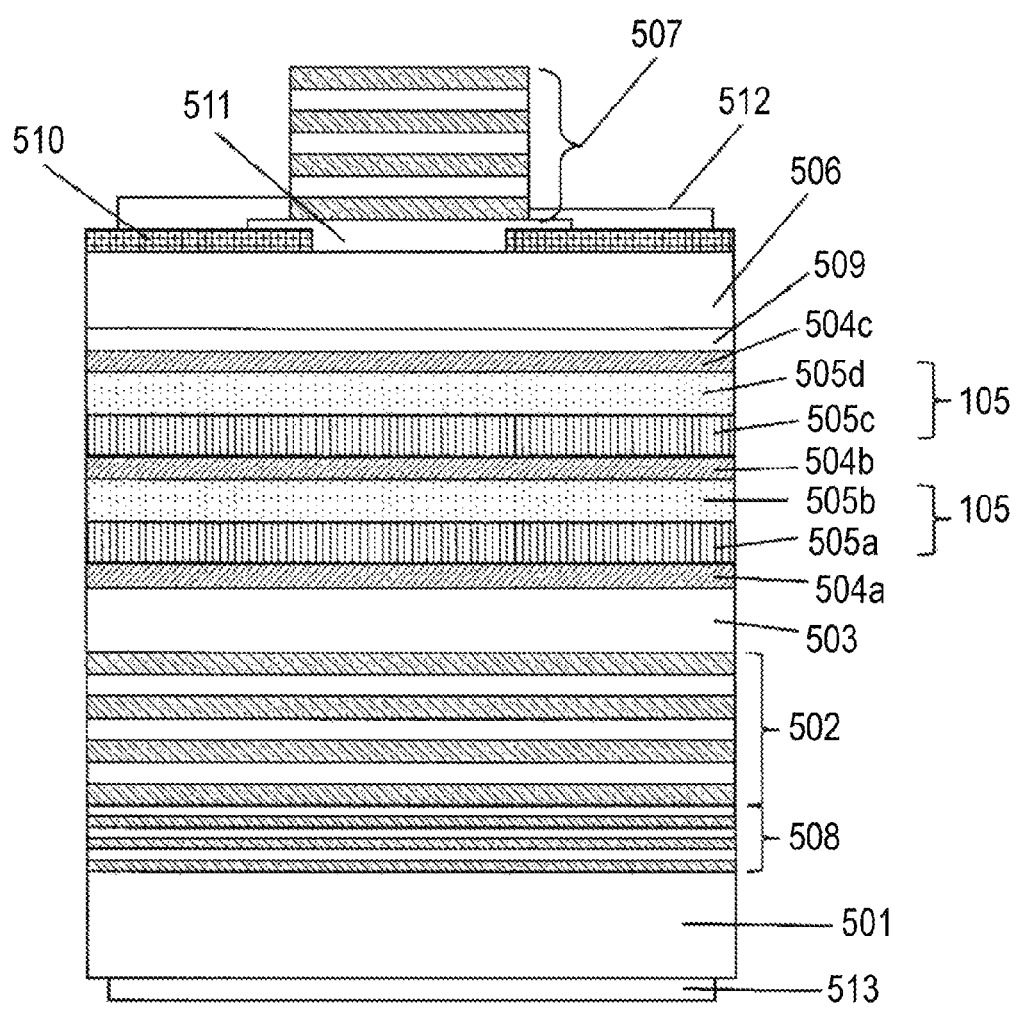
FIG. 5 is a cross sectional view describing a configuration example of a surface emitting laser in a second embodiment of the present invention.

As a second embodiment, a configuration example of a nitride semiconductor surface emitting laser and a method of manufacturing the same having a different form from the first embodiment will be described with reference to FIG. 5.

A nitride semiconductor surface emitting laser of the present exemplary embodiment is provided with a structure in which the number of active layers is three and a gain is larger than previous cases. The thickness between the active layers is $0.5\lambda$.

An n-type GaN substrate 501 is used as a substrate 101.

Next, a superlattice 508 of $Al_{0.50}Ga_{0.50}N/GaN$ as a strain reducing layer for forming a lower DBR 102 is formed on the n-GaN substrate 501. The thickness of both of the substrate and the superlattice is 4 nm. As the lower DBR 102, a DBR 502 of $Al_{0.50}Ga_{0.50}N/GaN$ is formed. $Al_{0.50}Ga_{0.50}N$ having the thickness of $\lambda/4$ and GaN are made into a pair, and are provided by 40 periods.

Following that, n-GaN 503 as an n-type spacer layer 103, and a quantum well structure 504a of 3 periods of $In_{0.10}Ga_{0.90}N/GaN$ as a first active layer 104 are formed. Next, as a first intermediate layer 105, p-GaN 505a with which Mg is doped as an Mg-doped layer 105a is formed by 48 nm and $In_{0.01}Ga_{0.99}N$ 505b having the thickness of 30 nm is formed as a nitride semiconductor layer 105b including In.

Next, a quantum well structure 504b of 3 periods of $In_{0.10}Ga_{0.90}N/GaN$ is formed as a second active layer 104.

Following that, p-GaN 505c with which Mg is doped is formed by 48 nm and $In_{0.01}Ga_{0.99}N$ 505d having the thickness of 30 nm are formed as a second intermediate layer 105, and a quantum well structure 504c of 3 periods of $In_{0.10}Ga_{0.90}N/GaN$ is formed as a third active layer 104.

To sufficiently inject electrons into the third active layer 504c, the Mg concentration of the p-GaN 505a in the first intermediate layer 105 is doped by about $5 \times 10^{18}$ cm$^2$, and the Mg concentration of the p-GaN 505c in the intermediate layer 105 is doped by about $2 \times 10^{19}$ cm$^2$. As the rest of layers, $p-Al_{0.20}Ga_{0.80}N$ 509 for blocking the electrons and p-GaN 506 as a p-type spacer layer 106 are formed.

Next, $SiO_2$ 510 having an opening for current confinement is formed.

Following that, ITO 511 for current injection is formed at a portion of the opening of $SiO_2$, and a dielectric material DBR 507 of $Ta_2O_5/SiO_2$ as an upper DBR 107 is further formed on the ITO 511.

Finally, an electrode 512 and an electrode 513 for energization to a surface and a back surface of the substrate are formed, so that the nitride semiconductor surface emitting laser having a high output is completed.

Third Embodiment

Figure 6:
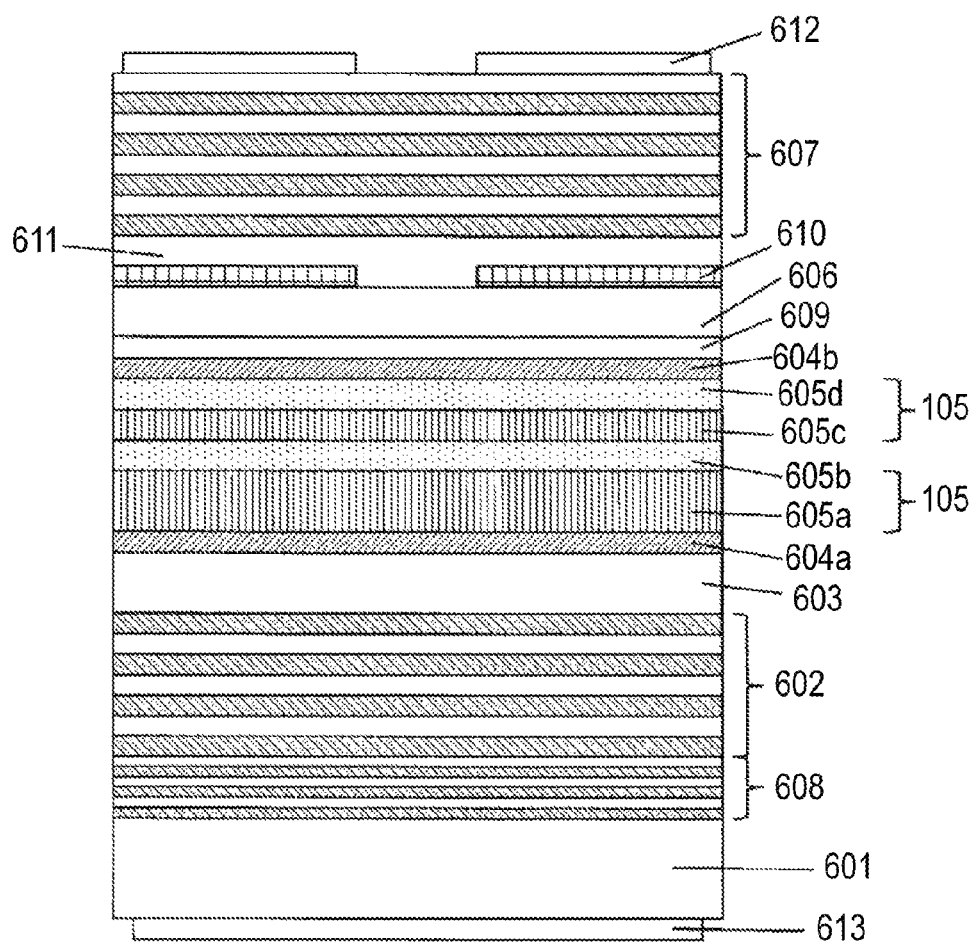
FIG. 6 is a cross sectional view describing a configuration example of a surface emitting laser in a third embodiment of the present invention.

As a third embodiment, a nitride semiconductor surface emitting laser and a method of manufacturing the same having a different form from the above-described exemplary embodiments will be described with reference to FIG. 6.

The nitride semiconductor surface emitting laser of the present exemplary embodiment provided with a structure in which the number of active layers is two and the thickness between the active layers is 1.02.

An n-type GaN substrate 601 is used as a substrate 101.

Next, a superlattice 608 of $Al_{0.50}Ga_{0.50}N/GaN$ as a strain reducing layer for forming a lower DBR 102 is formed on the n-GaN substrate 601. The thickness of both of the substrate and the superlattice is 4 nm.

As the lower DBR 102, a DBR 602 of $Al_{0.50}Ga_{0.50}N/GaN$ is formed.

$Al_{0.50}Ga_{0.50}N$ having the thickness of $\lambda/4$ and GaN are made into a pair, and are provided by 40 periods. Following that, n-GaN 603 as an n-type spacer layer 103, and a quantum well structure 604a of 3 periods of $In_{0.10}Ga_{0.90}N/GaN$ as a first active layer 104 are formed. Next, as an intermediate layer 105, p-GaN 605a with which Mg is doped as an Mg-doped layer 105a is formed by 30 nm and $In_{0.01}Ga_{0.99}N$ 605b having the thickness of 50 nm is formed as a nitride semiconductor layer 105b including In.

Further, a p-GaN layer 605c is formed by 46 nm, and $In_{0.01}Ga_{0.99}N$ 605d is formed by 30 nm, so that the $In_{0.01}Ga_{0.99}N$ 605b is met in a position of a peak of a stationary wave.

Next, a quantum well structure 604b of 3 periods of $In_{0.10}Ga_{0.90}N/GaN$ is formed as a second active layer 104.

As the rest of layers, $p-Al_{0.20}Ga_{0.80}N$ 609 for blocking electrons and p-GaN 606 as a p-type spacer layer 106 are formed.

Next, AlN 610 having an opening for current confinement is formed with an MOCVD system, lithography, and the like.

n-GaN 611 is formed on the AlN 610, so that a tunnel junction is formed. A DBR 607 of $Al_{0.50}Ga_{0.50}N/GaN$ is formed as an upper DBR 107.

Finally, an electrode 612 and an electrode 613 for energization to a surface and a back surface of the substrate are formed, so that the nitride semiconductor surface emitting laser is completed.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-242592, filed Nov. 2, 2012, which is hereby incorporated by reference herein in its entirety.

What is claimed is:

1. A surface emitting laser comprising:
   a first reflector;
   a plurality of active layers on the first reflector;
   a second reflector on the plurality of active layers;
   an n-type spacer layer formed between the first reflector and an active layer closest to the first reflector in the plurality of active layers;
   a p-type spacer layer formed between the second reflector and an active layer closest to the second reflector in the plurality of active layers; and
   an intermediate layer arranged between the plurality of active layers,
   wherein the intermediate layer comprises an Mg-doped layer including Mg and a nitride semiconductor layer including In, and
   the Mg-doped layer and the nitride semiconductor layer are provided in order from a side of the n-type spacer layer.

2. The surface emitting laser according to claim 1, wherein the plurality of active layers is arranged at positions of peaks of a stationary wave of light caused in a cavity configured from the first reflector and the second reflector.

3. The surface emitting laser according to claim 1, wherein the nitride semiconductor includes In, Ga and N.

4. The surface emitting laser according to claim 1, wherein the thickness of the nitride semiconductor layer is at least 30 nm or more.

5. The surface emitting laser according to claim 1, wherein the thickness of the nitride semiconductor layer is at least 200 nm or less.

6. The surface emitting laser according to claim 1, wherein the plurality of active layers is two active layers.

7. The surface emitting laser according to claim 1, wherein the plurality of active layers is three active layers.

8. The surface emitting laser according to claim 1, wherein the Mg-doped layer has high doping concentration at a side closer to the p-type spacer layer, and low doping concentration at a side closer to the n-type spacer layer.

9. The surface emitting laser according to claim 1, wherein the second reflector is a multilayer film reflector.

10. The surface emitting laser according to claim 1, wherein the first reflector is a multilayer film reflector.

11. The surface emitting laser according to claim 1, wherein the nitride semiconductor layer includes Mg.

12. The surface emitting laser according to claim 1, wherein each of the active layers comprises a plurality of quantum wells.

13. The surface emitting laser according to claim 12, wherein a number of the quantum wells of an active layer closer to the n-type spacer layer is larger than a number of quantum wells of an active layer closer to the p-type spacer layer.

14. A surface emitting laser comprising:
a first reflector;
a plurality of active regions on the first lower reflector, each of the active regions having a plurality of quantum wells;
a second reflector on the plurality of active regions; and
an intermediate layer arranged between the plurality of active regions,
wherein the intermediate layer comprises an Mg-doped layer including Mg and a nitride semiconductor layer including In, and
the Mg-doped layer and the nitride semiconductor layer are provided in order from a side of the first reflector.

15. The surface emitting laser according to claim 14, further comprising
an n-type spacer layer formed between the first reflector and an active region closest to the first reflector in the plurality of active regions; and
a p-type spacer layer formed between the second reflector and an active region closest to the second reflector in the plurality of active regions;
wherein the Mg-doped layer and the nitride semiconductor layer are provided in order from a side of the n-type spacer layer.

16. The surface emitting laser according to claim 15, wherein the distance between an active layer closest to the p-type layer in the plurality of active regions and an active layer closest to the n-type layer in the plurality of active regions is 200 nm or less.

17. The surface emitting laser according to claim 14, further comprising an n-type spacer layer on which the plurality of active regions are arranged,
wherein the Mg-doped layer and the nitride semiconductor layer are provided in order from a side of the n-type spacer layer.

18. The surface emitting laser according to claim 14, wherein the thickness of the nitride semiconductor layer is 30 nm or more and 200 nm or less.

19. A surface emitting laser comprising:
a first reflector;
a plurality of active regions on the first reflector;
a second reflector on the plurality of active regions; and
an intermediate layer arranged between the plurality of active regions,
wherein the intermediate layer comprises a nitride semiconductor including In,
at least a part of the intermediate layer includes Mg, and
in the part of the intermediate layer, concentration of Mg is higher on a side closer to the first reflector than on a side closer to the second reflector.

20. The surface emitting laser according to claim 19, further comprising
an n-type spacer layer formed between the first reflector and an active region closest to the first reflector in the plurality of active regions; and
a p-type spacer layer formed between the second reflector and an active region closest to the second reflector in the plurality of active regions,
wherein, in the part of the intermediate layer, concentration of Mg is higher on a side closer to the n-type spacer layer than on a side closer to the p-type spacer layer.

21. The surface emitting laser according to claim 20, wherein the distance between an active layer closest to the p-type layer in the plurality of active regions and an active layer closest to the n-type layer in the plurality of active regions is 200 nm or less.

22. The surface emitting laser according to claim 19, further comprising a substrate on which the plurality of active regions are arranged, wherein, in the part of the intermediate layer, concentration of Mg is higher on a side closer to the substrate than on a side farther to the substrate.

* * * * *